(12) United States Patent
Zou et al.

(10) Patent No.: US 11,094,838 B2
(45) Date of Patent: Aug. 17, 2021

(54) TEXTURIZATION METHOD OF SILICON WAFERS, PRODUCT OBTAINED THEREFROM AND PREPARATION METHOD OF SOLAR CELLS

(71) Applicants: CSI CELLS CO., LTD., Suzhou (CN); CSI Solar Power Group Co., Ltd., Suzhou (CN)

(72) Inventors: Shuai Zou, Suzhou (CN); Xiaoya Ye, Suzhou (CN); Fang Cao, Suzhou (CN); Xusheng Wang, Suzhou (CN); Guoqiang Xing, Suzhou (CN)

(73) Assignees: CSI CELLS CO., LTD., Suzhou (CN); CSI SOLAR POWER GROUP CO., LTD., Suzhou (CN)

( * ) Notice: Subject to any disclaimer, the term of this patent is extended or adjusted under 35 U.S.C. 154(b) by 0 days.

(21) Appl. No.: 16/400,098

(22) Filed: May 1, 2019

(65) Prior Publication Data
US 2019/0341509 A1    Nov. 7, 2019

(30) Foreign Application Priority Data

May 3, 2018 (CN) .......................... 201810415746.7

(51) Int. Cl.
*H01L 31/02* (2006.01)
*H01L 31/0236* (2006.01)
*H01L 21/306* (2006.01)

(52) U.S. Cl.
CPC .. *H01L 31/02363* (2013.01); *H01L 21/30604* (2013.01); *H01L 31/02008* (2013.01)

(58) Field of Classification Search
CPC ......... H01L 31/02363; H01L 21/30604; H01L 31/02008; H01L 31/02366; H01L 31/1804; Y02E 10/547; C30B 29/06; C30B 33/10

USPC ............................................ 216/83; 438/573
See application file for complete search history.

(56) References Cited

U.S. PATENT DOCUMENTS

| | | | |
|---|---|---|---|
| 8,075,792 B1* | 12/2011 | Branz ............... | H01L 31/02363 216/89 |
| 2015/0056818 A1* | 2/2015 | Levy ................. | H01L 21/02019 438/753 |
| 2015/0357506 A1* | 12/2015 | Ahearn ............. | H01L 31/02363 438/57 |

FOREIGN PATENT DOCUMENTS

CN     105006496 A    10/2015

OTHER PUBLICATIONS

Translation of CN105006496B, Oct. 28, 2015 (Year: 2015).*

* cited by examiner

*Primary Examiner* — Duy Vu N Deo
(74) *Attorney, Agent, or Firm* — Schmeiser, Olsen & Watts, LLP

(57) ABSTRACT

The present disclosure relates to a method for preparing nano-textured surface on single side of a silicon wafer, including the following steps: (1) superimposing two silicon wafers to obtain a first silicon wafer superimposition structure; the side on which the silicon wafers is superimposed is recorded as an attached surface, and the side exposed outside is recorded as an exposed surface; and (2) performing nano-textured surface etching on the first silicon wafer superimposition structure; and providing each silicon wafer with nano-textured surface on the exposed surface and a nano-textured surface etched strip on the edge of the attached surface. In the present disclosure, while the nano-textured surface etching is performed, the edge of the attached surface is etched with nano-textured surface by selecting a specific etching rate, which reduces the pulling force for detaching the wafers and reduces the fragmentation rate during the detaching process.

16 Claims, No Drawings

TEXTURIZATION METHOD OF SILICON WAFERS, PRODUCT OBTAINED THEREFROM AND PREPARATION METHOD OF SOLAR CELLS

CROSS-REFERENCE TO RELATED APPLICATIONS

This application claims priority to Chinese Patent Applications No. 201810415746.7, filed on May 3, 2018, the contents of which are incorporated herein in its entirety by reference.

FIELD OF TECHNOLOGY

The following relates to the technical field of solar cells, and particularly relates to a texturization method of silicon wafers, a product obtained therefrom and a preparation method of solar cells.

BACKGROUND

The surface of an untreated raw silicon wafer has a very high reflectivity, and the preparation of a solar cell directly from this material has a large optical loss, which reduces the photoelectric conversion efficiency of the solar cell. In order to increase the absorption of incident light, conventional anisotropic/isotropic chemical etching methods are industrially mature methods for preparing micro-sized textured surfaces of solar cells.

Various methods are disclosed in known art in order to reduce the surface reflectivity of the polycrystalline silicon wafers and increase the photo-generated current density of the cells, such as reactive ion etching method, electrochemical etching method, femtosecond laser texturization method and metal catalytic chemical etching method.

With regard to the etching of silicon wafers, most of the existing technologies are double-sided texturization. However, the subsequent process requires only a single side with nano-textured surface, and thus the nano-textured surface on the other side needs to be removed by etching, resulting in the waste of etching solution and etching process, thinned etched silicon wafers as well as increased fragmentation rate. The use of two silicon wafers in a lamination form for texturization can save etching solution and etching process, however, once the laminated wafer is subjected to single-sided nano-texturization, the single-sided textured silicon wafers which are mutually joined are closely attached, which results in greatly increased fragmentation rate since the detaching force is not sufficient in the subsequent separation operation.

Accordingly, there is a need in the art to develop a texturization method of silicon wafers having simpler process steps and a preparation method of solar cells that is dependent on the texturization method, which texturization method is expected to solve the problem that laminations are not easily separated during the single-sided texturization process and the fragmentation rate is high.

SUMMARY

In view of the deficiencies of the existing technologies, the present disclosure aims to provide a texturization method of silicon wafers, comprising the following steps:
(1) superimposing two silicon wafers to obtain a first silicon wafer superimposition structure; the side on which each silicon wafer is superimposed is recorded as an attached surface, and the side exposed outside is recorded as an exposed surface; and
(2) performing nano-textured surface etching on the first silicon wafer superimposition structure; and providing each silicon wafer with nano-textured surface on the exposed surface thereof and a nano-textured surface etched strip on the edge of the attached surface thereof.

In the present disclosure, by performing nano-textured surface etching on the first silicon wafer superimposition structure, the exposed surface and the edge of the attached surface can be etched into nano-textured surfaces. Since the attached surface is etched by the nano-textured surface etching solution penetrating thereinto in a limited amount, the obtained nano-textured surface etched strip has loose texture, more voids and a reduced contact surface. Therefore, the two wafers are easy to be separated during the detaching process with a low fragmentation rate.

The etching rate for a single silicon wafer is 0.1 mg/s or more during the nano-textured surface etching in the step (2), e.g. 0.2 mg/s, 0.3 mg/s, 0.4 mg/s, 0.5 mg/s, 0.6 mg/s, 0.7 mg/s, 0.8 mg/s, 0.9 mg/s and the like.

The etching rate is a ratio of the mass difference of a single silicon wafer before and after etching to the etching time in a solution having etching capability.

During the nano-textured surface etching, the etching rate for a single silicon wafer is controlled to be 0.1 mg/s or more, so that a part of the nano-textured surface etching solution penetrates into the attached surfaces of the first silicon wafer superposition structure, and etches the edge of the attached surface to form a small amount of nano-textured surface, which can reduce the binding potential energy of the two silicon wafers during the detaching process and thus reduce the fragmentation rate during the detaching process.

The width of the nano-textured surface etched region formed on the edge of the attached surface is not specifically limited herein. From experimental results, the larger the width, the lower the binding potential energy of the two silicon wafers and the lower the fragmentation rate. However, the excessive width can result in the waste of the etching solution, and may cause the binding potential energy to increase again.

It should be noted that the etching rate of the present disclosure refers to an etching rate of a single silicon wafer in a solution having etching capability, such as an etching rate when hydrogen fluoride and hydrogen peroxide are present in the solution.

The method of the present disclosure comprises a plurality of etching steps, and the etching rate in each etching step is a ratio of a mass difference of a single silicon wafer before and after etching to the etching time in a solution having etching capability.

The nano-textured surface etched strip of the attached surface has an average width of 0.1-20 mm, e.g. 0.2 mm, 0.5 mm, 0.8 mm, 1 mm, 2 mm, 3 mm, 5 mm, 7 mm, 9 mm, 13 mm, 15 mm, 18 mm and the like.

As a first preferred technical solution, the nano-textured surface etching process of the exposed surface of the silicon wafers in the step (2) specifically comprises:
(2a) immersing the first silicon wafer superimposition structure in a first nano-textured surface etching solution to perform nano-textured surface etching.

In the step (2a), the etching rate for a single silicon wafer in the first nano-textured surface etching solution is 0.2 mg/s-0.6 mg/s, e.g. 0.5 mg/s, 0.4 mg/s, 0.3 mg/s and the like.

When the etching rate for a single silicon wafer in the first nano-textured surface etching solution is less than 0.6 mg/s, the amount of bubbles generated is insufficient to completely separate the silicon wafers of the first silicon wafer superimposition structure and the etching solution cannot penetrate into the entire surface of the attached surface, that is, only the edge of the attached surface is opened, and the entire surface of the attached surface cannot be subjected to nano-textured surface etching, instead, only the exposed surface and the edge of the attached surface can be subjected to nano-textured surface etching.

The first nano-textured surface etching solution comprises metal silver ions, hydrogen fluoride and hydrogen peroxide dispersed in water.

The concentration of the metal silver ions in the first nano-textured surface etching solution is $5 \times 10^{-6}$-$5 \times 10^{-3}$ mol/L, e.g. $6 \times 10^{-6}$ mol/L, $8 \times 10^{-6}$ mol/L, $2 \times 10^{-5}$ mol/L, $5 \times 10^{-5}$ mol/L, $8 \times 10^{-5}$ mol/L, $3 \times 10^{-4}$ mol/L, $6 \times 10^{-4}$ mol/L, $9 \times 10^{-4}$ mol/L, $2 \times 10^{-3}$ mol/L, $3 \times 10^{-3}$ mol/L and the like.

The concentration of the hydrogen fluoride in the first nano-textured surface etching solution is 1-20 wt %, e.g. 2 wt %, 4 wt %, 8 wt %, 12 wt %, 15 wt %, 17 wt %, 19 wt % and the like.

The concentration of the hydrogen peroxide in the first nano-textured surface etching solution is 0.05-5 wt %, e.g. 1 wt %, 1.5 wt %, 2 wt %, 2.5 wt %, 3 wt %, 3.5 wt %, 4 wt % and the like.

The nano-textured surface etching of the exposed surfaces of the silicon wafer superimposition structure in the first nano-textured surface etching solution is performed at a temperature of 15-45° C. (e.g. 20° C., 25° C., 30° C., 35° C., 40° C. and the like) for 50-500 s (e.g. 60 s, 80 s, 150 s, 200 s, 250 s, 300 s, 350 s, 400 s, 450 s and the like).

In the first preferred technical solution, a suitable etching solution composition can achieve a suitable etching rate (0.2-0.6 mg/s) and can thereby achieve lower silicon wafer binding potential energy and lower fragmentation rate. However, it should be noted that the etching solution composition and/or etching conditions (such as temperature and the like) provided by the first preferred technical solution aims to achieve a suitable etching rate (e.g. 0.1 mg/s or more), but the achievement of the suitable etching rate does not necessarily depend on the etching solution composition and/or etching conditions provided by the first preferred technical solution, for example, a combination of a lower content of hydrogen peroxide and a higher temperature may also result in a suitable etching rate.

As a second preferred technical solution, the nano-textured surface etching process in the step (2) specifically comprises:

(2a') immersing the first silicon wafer superposition structure in a dispersion for adsorbing metal nanoparticles to adsorb the metal nanoparticles on the exposed surfaces of the silicon wafers;

(2b') immersing the first silicon wafer superposition structure treated by the step (2a') in a second nano-textured surface etching solution to perform nano-textured surface etching.

The dispersion for adsorbing metal nanoparticles in the step (2a') comprises metal silver ions and hydrogen fluoride dispersed in water.

The concentration of the metal silver ions in the dispersion for adsorbing metal nanoparticles is $5 \times 10^{-6}$-$5 \times 10^{-3}$ mol/L, e.g. $6 \times 10^{-6}$ mol/L, $8 \times 10^{-6}$ mol/L, $2 \times 10^{-5}$ mol/L, $5 \times 10^{-5}$ mol/L, $8 \times 10^{-5}$ mol/L, $3 \times 10^{-4}$ mol/L, $6 \times 10^4$ mol/L, $9 \times 10^{-4}$ mol/L, $2 \times 10^{-3}$ mol/L, $3 \times 10^{-3}$ mol/L and the like.

The concentration of the hydrogen fluoride in the dispersion for adsorbing metal nanoparticles is 0.6-2 wt %, e.g. 0.7 wt %, 0.9 wt %, 1.3 wt %, 1.5 wt %, 1.7 wt %, 1.9 wt % and the like.

The adsorption of the metal nanoparticles of the step (2a') is performed at a temperature of 15-45° C. (e.g. 20° C., 25° C., 30° C., 35° C., 40° C. and the like) for 20-200 s (e.g. 60 s, 80 s, 120 s, 140 s, 150 s, 170 s, 180 s, 190 s and the like).

In the step (2b'), the etching rate for a single silicon wafer in the second nano-textured surface etching solution is 0.4-0.6 mg/s, e.g. 0.45 mg/s, 0.50 mg/s, 0.55 mg/s and the like.

When the etching rate for a single silicon wafer in the second nano-textured surface etching solution is less than 0.6 mg/s, the amount of bubbles generated is insufficient to completely separate the silicon wafers of the first silicon wafer superimposition structure and the etching solution cannot penetrate into the entire surface of the attached surface, that is, only the edge of the attached surface is opened, and the entire surface of the attached surface cannot be subjected to nano-textured surface etching, instead, only the exposed surface and the edge of the attached surface can be subjected to nano-textured surface etching.

The second nano-textured surface etching solution in the step (2b') comprises hydrogen fluoride and hydrogen peroxide dispersed in water, with a hydrogen peroxide concentration of 1-18 wt % (e.g. 2 wt %, 5 wt %, 7 wt %, 9 wt %, 10 wt %, 12 wt %, 16 wt %, 17 wt % and the like) and a hydrogen fluoride concentration of 6-9 wt % (e.g. 6.5 wt %, 7 wt %, 7.5 wt %, 8 wt %, 8.5 wt % and the like).

The nano-textured surface etching in the step (2b') is performed at a temperature of 15-45° C. (e.g. 20° C., 25° C., 30° C., 35° C., 40° C. and the like) for 50-500 s (e.g. 60 s, 80 s, 150 s, 200 s, 250 s, 300 s, 350 s, 400 s, 450 s and the like).

In the second preferred technical solution, a suitable composition of the second nano-textured surface etching solution can achieve a suitable etching rate of 0.1 mg/s and can thereby achieve lower silicon binding potential energy and lower fragmentation rate. However, it should be noted that the etching solution composition and/or etching conditions (such as temperature and the like) provided by the second preferred technical solution aims to achieve a suitable etching rate of 0.1 mg/s, but the achievement of the suitable etching rate does not necessarily depend on the etching solution composition and/or etching conditions provided by the second preferred technical solution, for example, a combination of a lower content of hydrogen peroxide and a higher temperature may also result in a suitable etching rate.

However, it should be noted that, for the first preferred technical solution and the second preferred technical solution, when the etching rates are the same, the nano-textured surface etched strip is wider and the detaching force is smaller in the first preferred technical solution.

A step (2') is performed in prior to the step (2):

(2') immersing the first silicon wafer superposition structure in a micro-textured surface etching solution, and performing micro-textured surface etching of the silicon wafers on at least the exposed surfaces of the first silicon wafer superposition structure.

The step (2') is performed between the step (1) and the step (2).

The micro-textured surface etching of the present disclosure is used to remove the damaged layer on the surface of the silicon wafers. However, the etching solution we use can cause the formation of protuberances similar to micro-textured surface while removing damage, therefore it is defined as micro-textured surface etching solution, which can also be replaced by a polishing solution.

In the present disclosure, the first silicon wafer superposition structure obtained by superimposing two silicon wafers is directly subjected to micro-textured surface etching, followed by nano-textured surface etching. As compared to CN105006496A, the present disclosure omits the step of taking out the micro-textured surface etched silicon wafer and then superimposing.

It should be noted that the micro-textured surface etching is not an indispensable step. Once the micro-textured surface etching is performed, other area than the nano-textured surface etched strip in the attached surface is micro-textured surface.

The etching rate for a single silicon wafer in the micro-textured surface etching solution is more than 0.6 mg/s during the micro-textured surface etching in the step (2'), e.g. 0.7 mg/s, 0.8 mg/s, 0.9 mg/s, 1.0 mg/s, 1.2 mg/s, 1.5 mg/s, 1.8 mg/s, 2.0 mg/s, 2.5 mg/s and the like.

As the etching rate for a single silicon wafer in the micro-textured surface etching solution is increased, bubbles generated in the micro-textured surface etching process are increased and the bubble generation rate is increased, so that the micro-textured surface etching solution is more easily to enter the attached surfaces of the first silicon wafer superposition structure to realize micro-textured surface etching of the attached surfaces. However, in the micro-textured surface etching process provided by the present disclosure, it is not necessarily required that the micro-textured surface etching solution must enter the attached surfaces of the first silicon wafer superposition structure to realize micro-textured surface etching of the attached surfaces, instead, it is only required that at least the exposed surfaces can be micro-textured surface etched.

In the present disclosure, the etching rate for a single silicon wafer in the micro-textured surface etching solution has been defined, while the type and concentration of the micro-textured surface etching solution are not specifically limited, and those skilled in the art can select the micro-textured surface etching solution in accordance with the actual situation.

The micro-textured surface etching solution comprises an alkaline etching solution, preferably comprises any one selected from the group consisting of a potassium hydroxide solution, a sodium hydroxide solution, a tetramethylammonium hydroxide solution, and a combination of at least two selected therefrom.

The concentration of the alkaline substance in the alkaline etching solution is 0.5-20 wt %, e.g. 0.8 wt %, 2 wt %, 5 wt %, 8 wt %, 10 wt %, 12 wt %, 15 wt %, 17 wt %, 19 wt % and the like.

The "performing micro-textured surface etching of the silicon wafers on at least the exposed surfaces of the first silicon wafer superposition structure" in the step (2') is "performing micro-textured surface etching of the silicon wafers on both the exposed surfaces and the attached surfaces of the first silicon wafer superposition structure".

During the step of "performing micro-textured surface etching of the silicon wafers on both the exposed surfaces and the attached surfaces of the first silicon wafer superposition structure", the etching rate for a single silicon wafer in the micro-textured surface etching solution is 1 mg/s or more, e.g. 1.2 mg/s, 1.5 mg/s, 1.8 mg/s, 2.0 mg/s, 2.5 mg/s, 2.7 mg/s, 2.9 mg/s, 3.5 mg/s, 3.8 mg/s and the like.

The micro-textured surface etching is performed at a temperature of 50-95° C. (e.g. 55° C., 60° C., 65° C., 70° C., 75° C., 80° C., 85° C., 90° C.) for 50-500 s (e.g. 60 s, 80 s, 100 s, 150 s, 200 s, 260 s, 300 s, 380 s, 420 s, 480 s and the like), preferably 100-300 s.

The size of the silicon wafer is not specifically limited herein, and any silicon wafer can be used in the present disclosure.

The silicon wafer has a size of 156 mm×156 mm, 156.75 mm×156.75 mm, 157 mm×157 mm, 161 mm×161 mm or 166 mm×166 mm.

The silicon wafer comprises a diamond wire-cut silicon wafer or a direct silicon wafer.

The direct silicon wafer of the present disclosure refers to a silicon wafer which is directly formed without high temperature ingot casting, and is a recognized name in the industry.

The silicon wafer cassette has a silicon wafer placing groove having a width greater than the thickness of two silicon wafers.

A step (3) is further performed after the step (2) to detach the first silicon wafer superposition structure into single silicon wafers.

The method for detaching the first silicon wafer superposition structure into single silicon wafers comprises fixing one piece of silicon wafer of the first silicon wafer superposition structure, and pulling the other piece of silicon wafer with a force parallel to the surface thereof to realize disassembly.

The method for detaching the first silicon wafer superposition structure into single silicon wafers comprises using first vacuum adsorption heads to adsorb and fix one piece of silicon wafer of the first silicon wafer superposition structure, using second vacuum adsorption heads to adsorb the other piece of silicon wafer, and applying a given force parallel to the surface of the silicon wafer to the second vacuum adsorption heads to detach the first silicon wafer superposition structure.

A step (3a) is performed in prior to the step (3) to dehydrate the exposed surfaces of the silicon wafers, and after dehydration, the liquid adsorbed by the attached surfaces of the first silicon wafer superposition structure is retained.

Retaining the liquid adsorbed by the attached surfaces of the first silicon wafer superposition structure can further reduce the silicon wafer binding potential energy and achieve a lower fragmentation rate. The "liquid adsorbed by the attached surfaces" may be a residual liquid of a step in prior to the step (3a), for example, the liquid is nano-textured surface etching solution when the step (3a) is preceded by a nano-textured surface etching step.

A step (3b) is further performed after the step (3) to immerse and wash the exposed surfaces of the silicon wafers in a uniform orientation.

The immersion cleaning means that the first silicon wafer superposition structure is immersed in the cleaning solution for cleaning.

A second purpose of the present disclosure is to provide a silicon wafer having nano-textured surface on one side and a nano-textured surface etched strip on the edge of the other side.

The nano-textured surface etched strip of the silicon wafer has an average width of 0.1 mm-1 mm, e.g. 0.2 mm, 0.3 mm, 0.4 mm, 0.5 mm, 0.6 mm, 0.7 mm, 0.8 mm, 0.9 mm and the like.

Other portions of the other side of the silicon wafer than the nano-textured surface etched strip on the edge is micro-textured surface.

The micro-textured surface of the present disclosure may also be referred to as a polished surface.

When the etching rate in the step (2') is 1 mg/s or more and the etching rate in the step (2) is 0.1-0.6 mg/s, the silicon wafer can be provided with a structure comprising nano-textured surface on one side, and micro-textured surface and a nano-textured surface etched strip on the edge on the other side.

The silicon wafer according to the second purpose of the present disclosure can be obtained by the steps (1)-(2), steps (3a) and (3) according to the first purpose, and can also be obtained by the steps (1)-(2), steps (3a), (3), (3b) and (3c) according to the first purpose.

A third purpose of the present disclosure is to provide a silicon wafer assembly unit, and the silicon wafer assembly unit comprises two superimposed silicon wafers having nano-textured surface on the exposed surface and a nano-textured surface etched strip on the edge of the attached surface.

The nano-textured surface etched strip has an average width of 0.1-20 mm.

Other portions of the attached surface than the nano-textured surface etched strip on the edge is micro-textured surface.

The silicon wafer according to the third purpose of the present disclosure can be obtained by the steps (1)-(2) and step (3a) or by the steps (1)-(2) according to the first purpose.

A fourth purpose of the present disclosure is to provide a preparation method of solar cells comprising the following steps:
(a1) preparing PN junction on the nano-textured surface side of the silicon wafer according to the second purpose, to obtain a silicon wafer having PN junction;
(a2) etching to remove the PN junction path on both sides of the silicon wafer;
(a3) forming an anti-reflection film on the nano-textured surface side of the silicon wafer; and
(a4) forming a metal-semiconductor ohmic contact on both sides of the silicon wafer.

Or, the preparation method of solar cells comprises the following steps:
(b1) placing the silicon wafer assembly unit according to the third purpose in a diffusion furnace for PN junction diffusion to obtain a silicon wafer assembly unit having PN junction on the exposed surfaces;
(b2) detaching the silicon wafer assembly unit having PN junction on the exposed surfaces into single pieces, and etching to remove the PN junction path on both sides of the silicon wafer;
(b3) forming an anti-reflection film on the nano-textured surface side of the silicon wafer; and
(b4) forming a metal-semiconductor ohmic contact on both sides of the silicon wafer.

Or, the preparation method of solar cells s comprises the following steps:
(c1) detaching the silicon wafer assembly unit according to the third purpose into single pieces;
(c2) preparing PN junction on the nano-textured surface side of the silicon wafer obtained by the detaching in the step (c1), to obtain a single silicon wafer having PN junction;
(c3) etching the single silicon wafer having PN junction to remove the PN junction path on both sides of the silicon wafer;
(c4) forming an anti-reflection film on the nano-textured surface side of the silicon wafer; and (c5) forming a metal-semiconductor ohmic contact on both sides of the silicon wafer.

Or, the preparation method of solar cells comprises the following steps:
(d1) attaching the non-nano-textured surface sides of the silicon wafers according to the second purpose to obtain a second silicon wafer superposition structure;
(d2) placing the second silicon wafer superimposition structure in a diffusion furnace for PN junction diffusion to obtain a silicon wafer having PN junction;
(d3) detaching the second silicon wafer superimposition structure into single pieces, and etching to remove the PN junction path on both sides of the silicon wafer having PN junction;
(d4) forming an anti-reflection film on the nano-textured surface side of the silicon wafer; and
(d5) forming a metal-semiconductor ohmic contact on both sides of the silicon wafer.

A fifth purpose of the present disclosure is to provide a preparation method of solar modules, comprising the following steps:
(z1) preparing solar cells by the preparation method according to the fourth purpose; and
(z2) assembling the solar cells to obtain a solar module.

As compared to the existing technologies, the present disclosure has the following beneficial effects:
(1) in the present disclosure, the silicon wafers are subjected to texturization in the form of a first silicon wafer superposition structure from the beginning to the end, thus nano-textured surface can be formed at least on the exposed surface of the silicon wafer, omitting the step of textured surface etching a single wafer and saving the etching solution and the etching process;
(2) in the present disclosure, while the nano-textured surface etching is performed, the edge of the attached surface is etched with a nano-textured surface etched strip, which can reduce the pulling force for detaching the wafers and reduce the fragmentation rate during the detaching process;
(3) in the preparation process of solar cells, the first silicon wafer superposition structure is optionally further used for steps such as diffusion and etching, thereby improving the production efficiency and simplifying the preparation process.

DETAILED DESCRIPTION

In order to facilitate the understanding of the present disclosure, some examples are set forth herein below. Those skilled in the art shall understand that the examples are set forth to assist in understanding the present disclosure and should not be regarded as specific limitations to the present disclosure.

All the silicon wafers used in the following examples have a size of 156 mm×156 mm, and those skilled in the art can replace them with other sizes of silicon wafers (such as 156.75 mm×156.75 mm, 157 mm×157 mm, 161 mm×161 mm, or 166 mm×166 mm and the like), while the method steps can be left unadjusted.

Example 1

A method for preparing nano-textured surface on single side of a silicon wafer, comprising the following steps:

(1) two silicon wafers were superimposed to obtain a first silicon wafer superimposition structure, and the first silicon wafer superposition structure was loaded in a silicon wafer cassette;

(2) the silicon wafer cassette loaded with the first silicon wafer superposition structure was immersed in a micro-textured surface etching solution (a sodium hydroxide solution with a concentration of 10 wt %), soaked at 70±3° C. for 200 s to perform micro-textured surface etching of silicon wafers both the exposed surfaces and the attached surfaces of the first silicon wafer superposition structure; and the etching rate of the micro-textured surface etching solution was set as 3 mg/s for a single silicon wafer;

(3a) the silicon wafer cassette loaded with the first silicon wafer superposition structure etched in step (2) was immersed in a first nano-textured surface etching solution, soaked at 30±3° C. for 200 s to perform nano-textured surface etching of the exposed surfaces of the first silicon wafer superposition structure at an etching rate of 0.4 mg/s; and the first nano-textured surface etching solution contains $5 \times 10^{-5}$ mol/L of silver nitrate, 8 wt % of hydrogen fluoride and 10 wt % of hydrogen peroxide;

(4) the first silicon wafer superposition structure was dehydrated to remove the water on the exposed surfaces, and retain the water on the attached surfaces;

(5) comb-shaped first vacuum adsorption heads were inserted into the cassette to ensure that each of the first vacuum adsorption heads sucked one of the silicon wafers in the first silicon wafer superposition structure, and then second vacuum adsorption heads were inserted into the cassette to ensure that each of the second vacuum adsorption heads sucked the other silicon wafer in the first silicon wafer superposition structure, thereafter, the two wafers were pulled apart by a parallel pulling force to realize disassembly, and silicon wafers having nano-textured surface on one side and a nano-textured surface etched strip (with a width of 10-13 mm) on the edge of the other side and micro-textured surface as the rest were obtained; and (6) the exposed surfaces of the silicon wafers were uniformly loaded in a second silicon wafer cassette, and the second silicon wafer cassette was immersed in a deionized water tank for cleaning.

Example 2

The difference from Example 1 is that the step (3a) is as follows:
the silicon wafer cassette loaded with the first silicon wafer superposition structure etched in step (2) was immersed in a first nano-textured surface etching solution, soaked at 30±3° C. for 200 s to perform nano-textured surface etching of the exposed surfaces of the first silicon wafer superposition structure at an etching rate of 0.1 mg/s; and the first nano-textured surface etching solution contains $5 \times 10^{-5}$ mol/L of silver nitrate, 0.8 wt % of hydrogen fluoride and 2 wt % of hydrogen peroxide. Obtained in Example 2 were silicon wafers having nano-textured surface on one side and a nano-textured surface etched strip (with a width of 0.1-1 mm) on the edge of the other side and micro-textured surface as the rest.

Example 3

The difference from Example 1 is that the step (3a) is as follows:
the silicon wafer cassette loaded with the first silicon wafer superposition structure etched in step (2) was immersed in a first nano-textured surface etching solution, soaked at 30±3° C. for 200 s to perform nano-textured surface etching of the exposed surfaces of the first silicon wafer superposition structure at an etching rate of 0.2 mg/s; and the first nano-textured surface etching solution contains $5 \times 10^{-5}$ mol/L of silver nitrate, 3 wt % of hydrogen fluoride and 1 wt % of hydrogen peroxide. Obtained in Example 3 were silicon wafers having nano-textured surface on one side and a nano-textured surface etched strip (with a width of 3-10 mm) on the edge of the other side and micro-textured surface as the rest.

Example 4

The difference from Example 1 is that the step (3a) is as follows:
the silicon wafer cassette loaded with the first silicon wafer superposition structure etched in step (2) was immersed in a first nano-textured surface etching solution, soaked at 30±3° C. for 200 s to perform nano-textured surface etching of the exposed surfaces of the first silicon wafer superposition structure at an etching rate of 0.6 mg/s; and the first nano-textured surface etching solution contains $5 \times 10^{-5}$ mol/L of silver nitrate, 20 wt % of hydrogen fluoride and 4 wt % of hydrogen peroxide. Obtained in Example 4 were silicon wafers having nano-textured surface on one side and a nano-textured surface etched strip (with a width of 15-20 mm) on the edge of the other side and micro-textured surface as the rest.

Example 5

The difference from Example 1 is that the step (3a) is as follows:
the silicon wafer cassette loaded with the first silicon wafer superposition structure etched in step (2) was immersed in a first nano-textured surface etching solution, soaked at 30±3° C. for 200 s to perform nano-textured surface etching of the exposed surfaces of the first silicon wafer superposition structure at an etching rate of 0.5 mg/s; and the first nano-textured surface etching solution contains $5 \times 10^{-5}$ mol/L of silver nitrate, 16 wt % of hydrogen fluoride and 3 wt % of hydrogen peroxide. Obtained in Example 5 were silicon wafers having nano-textured surface on one side and a nano-textured surface etched strip (with a width of 16-18 mm) on the edge of the other side and micro-textured surface as the rest.

Example 6

The difference from Example 1 is that the step (3a) is as follows:
the silicon wafer cassette loaded with the first silicon wafer superposition structure etched in step (2) was immersed in a first nano-textured surface etching solution, soaked at 30±3° C. for 200 s to perform nano-textured surface etching of the exposed surfaces of the first silicon wafer superposition structure at an etching rate of 0.7 mg/s; and the first nano-textured surface etching solution contains $5 \times 10^{-5}$ mol/L of silver nitrate, 22 wt % of hydrogen fluoride and 6 wt % of hydrogen peroxide. Obtained in Example 6 were silicon wafers having nano-textured surface on one side and a nano-textured surface etched strip (with a width of 22-30 mm) on the edge of the other side and micro-textured surface as the rest.

Example 7

The difference from Example 1 is that the step (3a) is as follows:

(3a) the silicon wafer cassette loaded with the first silicon wafer superposition structure etched in step (2) was immersed in a first nano-textured surface etching solution, soaked at 20±3° C. for 200 s to perform nano-textured surface etching of the exposed surfaces of the first silicon wafer superposition structure at an etching rate of 0.4 mg/s; and the first nano-textured surface etching solution contains $5×10^{-5}$ mol/L of silver nitrate, 8 wt % of hydrogen fluoride and 10 wt % of hydrogen peroxide. Obtained in Example 7 were silicon wafers having nano-textured surface on one side and a nano-textured surface etched strip (with a width of 3-10 mm) on the edge of the other side and micro-textured surface as the rest.

Example 8

The difference from Example 1 is that the step (3a) is as follows:
(3a) the silicon wafer cassette loaded with the first silicon wafer superposition structure etched in step (2) was immersed in a first nano-textured surface etching solution, soaked at 40±3° C. for 200 s to perform nano-textured surface etching of the exposed surfaces of the first silicon wafer superposition structure at an etching rate of 0.6 mg/s; and the first nano-textured surface etching solution contains $5×10^{-5}$ mol/L of silver nitrate, 8 wt % of hydrogen fluoride and 10 wt % of hydrogen peroxide. Obtained in Example 8 were silicon wafers having nano-textured surface on one side and a nano-textured surface etched strip (with a width of 15-20 mm) on the edge of the other side and micro-textured surface as the rest.

Example 9

A method for preparing nano-textured surface on single side of a silicon wafer, comprising the following steps:
(1) two silicon wafers were superimposed to obtain a first silicon wafer superimposition structure, and the first silicon wafer superposition structure was loaded in a silicon wafer cassette;
(2a) the silicon wafer cassette loaded with the first silicon wafer superposition structure from the step (1) was immersed in a first nano-textured surface etching solution, soaked at 30±3° C. for 200 s to perform nano-textured surface etching of the exposed surfaces of the first silicon wafer superposition structure at an etching rate of 0.4 mg/s; and the first nano-textured surface etching solution contains $5×10^{-5}$ mol/L of silver nitrate, 8 wt % of hydrogen fluoride and 10 wt % of hydrogen peroxide;
(3) the first silicon wafer superposition structure was dehydrated to remove the water on the exposed surfaces, and retain the water on the attached surfaces;
(4) comb-shaped first vacuum adsorption heads were inserted into the cassette to ensure that each of the first vacuum adsorption heads sucked one of the silicon wafers in the first silicon wafer superposition structure, and then second vacuum adsorption heads were inserted into the cassette to ensure that each of the second vacuum adsorption heads sucked the other silicon wafer in the first silicon wafer superposition structure, thereafter, the two wafers were pulled apart by a parallel pulling force to realize disassembly, and silicon wafers having nano-textured surface on one side and a nano-textured surface etched strip (with a width of 10-13 mm) on the edge of the other side and micro-textured surface as the rest were obtained; and (5) the exposed surfaces of the silicon wafers were uniformly loaded in a second silicon wafer cassette, and the second silicon wafer cassette was immersed in a deionized water tank for cleaning.

Comparison Example 1

The difference from Example 1 is that the step (3a) is as follows:
the silicon wafer cassette loaded with the first silicon wafer superposition structure etched in step (2) was immersed in a first nano-textured surface etching solution, soaked at 30±3° C. for 200 s to perform nano-textured surface etching of the exposed surfaces of the first silicon wafer superposition structure at an etching rate of 0.08 mg/s; and the first nano-textured surface etching solution contains $5×10^{-5}$ mol/L of silver nitrate, 0.8 wt % of hydrogen fluoride and 0.05 wt % of hydrogen peroxide. Obtained in Comparison Example 1 were silicon wafers having nano-textured surface on one side and micro-textured surface on the other side.

Performance Test 1
(1) The parallel pulling forces used in the detaching process of the steps (5) of Examples 1-4 and Comparison Example 1 were recorded, and the parallel forces were divided by the total number of silicon wafers loaded in the cassette to obtain the detaching forces for each silicon wafer, which were recorded in Table 1;
(3) the widths of the nano-textured surface etched strips were simultaneously recorded in Table 1;

TABLE 1

| Serial number | Edge width (mm) | Detaching force (N) |
| --- | --- | --- |
| Example 1 | 10-13 mm | 2 |
| Example 2 | 0.1-1 mm | 6 |
| Example 3 | 3-10 mm | 3 |
| Example 4 | 15-20 mm | 2 |
| Example 5 | 16-18 mm | 2 |
| Example 6 | 22-30 mm | 5 |
| Example 7 | 3-10 mm | 3 |
| Example 8 | 15-20 mm | 2 |
| Example 9 | 10-13 mm | 2 |
| Comparison Example 1 | <0.1 mm | 9 |

It can be seen from Table 1 that with the appearance of the nano-textured surface etched strip of the attached surfaces (through the Comparison of Example 1 and Comparison Example 1), the detaching force is greatly reduced, which reduces the fragmentation rate in the detaching process; when the nano-textured surface etching rate was selected as 0.2-0.6 mg/s, the width of the nano-etched strip is 1-20 mm and the detaching force can be reduced to 2-6 N; when the nano-textured surface etching rate was selected as 0.6 mg/s or more, the width of the nano-etched strip is 20 mm or more and the detaching force is increased instead. It can be seen from the results of Examples 1, 7 and 8 that the increase in temperature increases the width of the nano-etched strip to a certain extent and reduces the detaching force. It can be seen from the results of Examples 1 and 9 whether or not micro-textured surface etching is performed has little effect on the edge width and the detaching force.

Example 10

The difference from Example 1 is that the step (3a) is replaced by the following steps:
(3a') the silicon wafer cassette loaded with the first silicon wafer superposition structure etched in step (2) was immersed in a dispersion for adsorbing metal nanoparticles, soaked at 30±3° C. for 100 s to absorb metal nanoparticles on the exposed surfaces of the first silicon wafer superposition structure; and the dispersion for adsorbing metal nanoparticles contains $5\times10^{-5}$ mol/L of silver ions and 1 wt % of hydrogen fluoride;
(3b') the silicon wafer cassette loaded with the first silicon wafer superposition structure treated in step (3a') was immersed in a second nano-textured surface etching solution, soaked at 30±3° C. for 200 s to perform nano-textured surface etching of the exposed surfaces of the first silicon wafer superposition structure at an etching rate of 0.4 mg/s; and the second nano-textured surface etching solution contains 8 wt % of hydrogen fluoride and 15 wt % of hydrogen peroxide;
Obtained in Example 10 were silicon wafers having nano-textured surface on one side and a nano-textured surface etched strip (with a width of 0.5-1 mm) on the edge of the other side and micro-textured surface as the rest.

Example 11

The difference from Example 1 is that the step (3a) is replaced by the following steps:
(3a') the silicon wafer cassette loaded with the first silicon wafer superposition structure etched in step (2) was immersed in a dispersion for adsorbing metal nanoparticles, soaked at 40±3° C. for 100 s to absorb metal nanoparticles on the exposed surfaces of the first silicon wafer superposition structure; and the dispersion for adsorbing metal nanoparticles contains $5\times10^{-6}$ mol/L of silver ions and 2 wt % of hydrogen fluoride;
(3b') the silicon wafer cassette loaded with the first silicon wafer superposition structure treated in step (3a') was immersed in a second nano-textured surface etching solution, soaked at 20±3° C. for 200 s to perform nano-textured surface etching of the exposed surfaces of the first silicon wafer superposition structure at an etching rate of 0.2 mg/s; and the second nano-textured surface etching solution contains 6 wt % of hydrogen fluoride and 18 wt % of hydrogen peroxide;
Obtained in Example 11 were silicon wafers having nano-textured surface on one side and a nano-textured surface etched strip (with a width of 0.1-0.5 mm) on the edge of the other side and micro-textured surface as the rest.

Example 12

The difference from Example 1 is that the step (3a) is replaced by the following steps:
(3a') the silicon wafer cassette loaded with the first silicon wafer superposition structure etched in step (2) was immersed in a dispersion for adsorbing metal nanoparticles, soaked at 20±3° C. for 100 s to absorb metal nanoparticles on the exposed surfaces of the first silicon wafer superposition structure; and the dispersion for adsorbing metal nanoparticles contains $5\times10^{-3}$ mol/L of silver ions and 0.6 wt % of hydrogen fluoride;
(3b') the silicon wafer cassette loaded with the first silicon wafer superposition structure treated in step (3a') was immersed in a second nano-textured surface etching solution, soaked at 40±3° C. for 200 s to perform nano-textured surface etching of the exposed surfaces of the first silicon wafer superposition structure at an etching rate of 0.5 mg/s; and the second nano-textured surface etching solution contains 9 wt % of hydrogen fluoride and 15 wt % of hydrogen peroxide;
Obtained in Example 12 were silicon wafers having nano-textured surface on one side and a nano-textured surface etched strip (with a width of 0.5-1 mm) on the edge of the other side and micro-textured surface as the rest.

Example 13

The difference from Example 1 is that the step (3a) is replaced by the following steps:
(3a') the silicon wafer cassette loaded with the first silicon wafer superposition structure etched in step (2) was immersed in a dispersion for adsorbing metal nanoparticles, soaked at 30±3° C. for 100 s to absorb metal nanoparticles on the exposed surfaces of the first silicon wafer superposition structure; and the dispersion for adsorbing metal nanoparticles contains $5\times10^{-5}$ mol/L of silver ions and 1 wt % of hydrogen fluoride;
(3b') the silicon wafer cassette loaded with the first silicon wafer superposition structure treated in step (3a') was immersed in a second nano-textured surface etching solution, soaked at 30±3° C. for 200 s to perform nano-textured surface etching of the exposed surfaces of the first silicon wafer superposition structure at an etching rate of 0.6 mg/s; and the second nano-textured surface etching solution contains 9 wt % of hydrogen fluoride and 18 wt % of hydrogen peroxide;
Obtained in Example 13 were silicon wafers having nano-textured surface on one side and a nano-textured surface etched strip (with a width of 0.5-1 mm) on the edge of the other side and micro-textured surface as the rest.

Example 14

The difference from Example 9 is that the step (2a) is replaced by the following steps:
(2a') the silicon wafer cassette loaded with the first silicon wafer superposition structure in step (1) was immersed in a dispersion for adsorbing metal nanoparticles, soaked at 30±3° C. for 50 s to absorb metal nanoparticles on the exposed surfaces of the first silicon wafer superposition structure; and the dispersion for adsorbing metal nanoparticles contains $5\times10^{-5}$ mol/L of silver ions and 1 wt % of hydrogen fluoride;
(2b') the silicon wafer cassette loaded with the first silicon wafer superposition structure treated in step (2a') was immersed in a second nano-textured surface etching solution, soaked at 30±3° C. for 200 s to perform nano-textured surface etching of the exposed surfaces of the first silicon wafer superposition structure at an etching rate of 0.4 mg/s; and the second nano-textured surface etching solution contains 8 wt % of hydrogen fluoride and 15 wt % of hydrogen peroxide;
Obtained in Example 10 were silicon wafers having nano-textured surface on one side and a nano-textured surface etched strip (with a width of 0.5-1 mm) on the edge of the other side and micro-textured surface as the rest.

Comparison Example 2

The difference from Example 1 is that the step (3a) is replaced by the following steps:
(3a') the silicon wafer cassette loaded with the first silicon wafer superposition structure etched in step (2) was immersed in a dispersion for adsorbing metal nanoparticles, soaked at 30±3° C. for 100 s to absorb metal nanoparticles on the exposed surfaces of the first silicon wafer superposition structure; and the dispersion for adsorbing metal nanoparticles contains $1\times10^{-3}$ mol/L of silver ions and 2 wt % of hydrogen fluoride;

(3b') the silicon wafer cassette loaded with the first silicon wafer superposition structure treated in step (3a') was immersed in a second nano-textured surface etching solution, soaked at 30±3° C. for 200 s to perform nano-textured surface etching of the exposed surfaces of the first silicon wafer superposition structure at an etching rate of 0.1 mg/s; and the second nano-textured surface etching solution contains 10 wt % of hydrogen fluoride and 35 wt % of hydrogen peroxide;

Obtained in Comparison Example 2 were silicon wafers having nano-textured surface on one side and micro-textured surface on the other side.

Performance Test 2

The parallel pulling forces used in the detaching process of the steps (5) of Examples 9-12 and Comparison Example 2 were recorded, and the parallel forces were divided by the total number of silicon wafers loaded in the cassette to obtain the detaching forced for each silicon wafer, which were recorded in Table 2;

(3) the widths of the nano-textured surface etched strips were simultaneously recorded in Table 2;

TABLE 2

| Serial number | Edge width (mm) | Detaching force (N) |
| --- | --- | --- |
| Example 10 | 0.5-1 mm | 5 |
| Example 11 | 0.1-0.5 mm | 6 |
| Example 12 | 0.5-1 mm | 5 |
| Example 13 | 0.5-1 mm | 5 |
| Example 14 | 0.5-1 mm | 5 |
| Comparison Example 2 | <0.1 mm | 9 |

It can be seen from Table 2 that for the two-step etching, the width of the nano-etched strip is 1-13 mm and the detaching force can be reduced to 5-6 N when the nano-textured surface etching rate is selected as 0.4-0.6 mg/s; and the width of the nano-etched strip obtained by the two-step method is smaller and the detaching force is larger than those of one-step method when the reaction rates are the same. It can be seen from the results of Examples 10 and 13 whether or not micro-textured surface etching is performed has little effect on the edge width and the detaching force.

The applicant declares that the present disclosure is described in detail by the above-described embodiments, but the present disclosure is not limited to the above detailed process equipments and process flows, that is, it does not mean that the present disclosure must be implemented in accordance with the detailed process equipments and process flows described above. It will be apparent to those skilled in the art that any modifications of the present disclosure, equivalent substitutions of the materials for the product of the present disclosure, and additions of auxiliary ingredients, selections of the specific means and the like, are all within the protection and present disclosure scopes of the present disclosure.

What is claimed is:

1. A texturization method of silicon wafers comprising:
   (1) superimposing two silicon wafers to obtain a first silicon wafer superimposition structure, wherein aside on which each silicon wafer is superimposed is recorded as an attached surface, and a side exposed outside is recorded as an exposed surface; and
   (2) performing nano-textured surface etching on the first silicon wafer superimposition structure, and providing each silicon wafer with nano-textured surface on the exposed surface thereof and a nano-textured surface etched strip on an edge of the attached surface thereof;
   wherein a step (2') is performed in prior to the step (2): immersing the first silicon wafer superposition structure in a micro-textured surface etching solution, and performing micro-textured surface etching of the silicon wafers on at least the exposed surfaces of the first silicon wafer superposition structure.

2. The method according to claim 1, wherein the nano-textured surface etched strip of the attached surface has an average width of 0.1-20 mm.

3. The method according to claim 1, wherein the nano-textured surface etching process in the step (2) specifically comprises:
   (2a) immersing the first silicon wafer superimposition structure in a first nano-textured surface etching solution to perform nano-textured surface etching.

4. The method according to claim 3, wherein in step (2a), an etching rate for a single silicon wafer in the first nano-textured surface etching solution is 0.2-0.6 mg/s.

5. The method according to claim 3, wherein the first nano-textured surface etching solution comprises metal silver ions, hydrogen fluoride and hydrogen peroxide dispersed in deionized water;
   a concentration of the metal silver ions in the first nano-textured surface etching solution is $5\times10^{-6}$-$5\times10^{-3}$ mol/L;
   a concentration of the hydrogen fluoride in the first nano-textured surface etching solution is 1-20 wt %; and
   a concentration of the hydrogen peroxide in the first nano-textured surface etching solution is 0.05-5 wt %.

6. The method according to claim 3, wherein the nano-textured surface etching in the first nano-textured surface etching solution is performed at a temperature of 15-45° C. for 50-500 s.

7. The method according to claim 1, wherein the nano-textured surface etching process in the step (2) specifically comprises:
   (2a') immersing the first silicon wafer superposition structure in a dispersion for adsorbing metal nanoparticles to adsorb metal nanoparticles on the exposed surfaces of the silicon wafers;
   (2b') immersing the first silicon wafer superposition structure treated by the step (2a') in a second nano-textured surface etching solution to perform nano-textured surface etching;
   the dispersion for adsorbing metal nanoparticles in the step (2a') comprises metal silver ions and hydrogen fluoride dispersed in water.

8. The method according to claim 7, wherein in the step (2b'), an etching rate for single silicon wafer in the second nano-textured surface etching solution is 0.4-0.6 mg/s;
   the second nano-textured surface etching solution in the step (2b') comprises hydrogen fluoride and hydrogen peroxide dispersed in deionized water, with a hydrogen peroxide concentration of 1-18 wt % and a hydrogen fluoride concentration of 6-9 wt %.

9. The method according to claim 7, wherein the nano-textured surface etching in the step (2b') is performed at a temperature of 15-45° C. for 50-500 s.

10. The method according to claim 1, wherein an etching rate for a single silicon wafer in the micro-textured surface etching solution is more than 0.6 mg/s during the micro-textured surface etching in the step (2').

11. The method according to claim 1, wherein the micro-textured surface etching solution comprises an alkaline etching solution;
   a concentration of the alkaline substance in the alkaline etching solution is 0.5-20 wt %.

12. The method according to claim 1, wherein the micro-textured surface etching is performed at a temperature of 50-95° C. for 50-500 s.

13. The method according to claim 1, wherein a step (3) is further performed after the step (2) to detach the first silicon wafer superposition structure into single silicon wafers.

14. The method according to claim 13, wherein the detaching the first silicon wafer superposition structure into single silicon wafers comprises fixing one piece of silicon wafer of the first silicon wafer superposition structure, and pulling the other piece of silicon wafer with a force parallel to the surface thereof to realize disassembly.

15. The method according to claim 13, wherein a step (3a) is performed in prior to the step (3), wherein the step (3') including dehydrating the exposed surfaces of the silicon wafers, and after the dehydrating, the liquid adsorbed by the attached surface of the first silicon wafer superposition structure is retained;
   a step (3b) is performed after the step (3), wherein the step (3b) includes immersing and washing the exposed surfaces of the silicon wafers in a uniform orientation.

16. The method according to claim 1, wherein the etching rate for a single silicon wafer is 0.1 mg/s or more during the nano-textured surface etching in the step (2); the etching rate is a ratio of the mass difference of a single silicon wafer before and after etching to the etching time in a solution having etching capability.

* * * * *